United States Patent
Kaaden et al.

(10) Patent No.: US 6,452,785 B1
(45) Date of Patent: Sep. 17, 2002

(54) CONSTRUCTION SYSTEM FOR LOAD FEEDERS WITH PERMANENT WIRING

(75) Inventors: Peter Kaaden, Schwandorf; Joachim Bury, Kümmersbruck, both of (DE)

(73) Assignee: Siemens AG, Munich (DE)

( * ) Notice: Subject to any disclaimer, the term of this patent is extended or adjusted under 35 U.S.C. 154(b) by 0 days.

(21) Appl. No.: 09/530,764

(22) PCT Filed: Oct. 21, 1998

(86) PCT No.: PCT/DE98/03094

§ 371 (c)(1),
(2), (4) Date: Aug. 17, 2000

(87) PCT Pub. No.: WO99/23737

PCT Pub. Date: May 14, 1999

(30) Foreign Application Priority Data

Nov. 3, 1997 (DE) .......................................... 197 48 531

(51) Int. Cl.[7] ................................................. H02B 1/26
(52) U.S. Cl. .................... 361/622; 361/624; 361/626; 361/634; 361/635; 361/636; 361/637; 439/715
(58) Field of Search ................................. 361/600, 602, 361/614, 622, 627–631, 633–637, 641–647, 652, 656, 657; 174/52.1, 59

(56) References Cited

U.S. PATENT DOCUMENTS

| | | | | |
|---|---|---|---|---|
| 5,184,278 A | * | 2/1993 | Jordan et al. | ................ 361/627 |
| 5,519,175 A | * | 5/1996 | Cole | ...................... 174/149 B |
| 5,610,493 A | * | 3/1997 | Wieloch | ..................... 361/600 |
| 5,629,831 A | | 5/1997 | Eggert et al. | |

FOREIGN PATENT DOCUMENTS

| | | | |
|---|---|---|---|
| DE | 44 02 001 | 7/1995 | |
| DE | 44 02 002 | 7/1995 | |
| DE | 44 38 804 | 3/1996 | |
| DE | 44 38 805 | 3/1996 | |
| DE | 44 38 806 | 3/1996 | |
| DE | 296 07 525 | 6/1996 | |
| DE | 195 25 438 | 1/1997 | |
| DE | 196 10 037 | 9/1997 | |
| DE | 196 10 559 | 9/1997 | |
| EP | 0 236 711 | 9/1987 | |
| EP | 0 311 574 A2 * | 4/1989 | ............ H02B/1/08 |
| EP | 0 364 618 | 4/1990 | |
| EP | 0 661 915 | 7/1995 | |
| EP | 0 748 013 | 12/1996 | |
| EP | 0 753 916 | 1/1997 | |
| WO | WO 96/42188 | 12/1996 | |

OTHER PUBLICATIONS

"Bussysteme in der Automatisierungstechnik," Schwerpunkt Steuerungs and Regelungstechnick, Jul. 23, 1996.
"Eigensichere Prozessmesstechnik mit Bus–Anschluss: Sanfter Übergang," iee 40, Nr. 10, Jan. 11, 1995.

* cited by examiner

Primary Examiner—Boris Chervinsky
(74) Attorney, Agent, or Firm—Harness, Dickey & Pierce, P.L.C.

(57) ABSTRACT

A load feeder of modular construction is provided. The load feeder includes a feeder assembly and a base lower part with integrated cable and/or bus sections. The base lower part can be expanded to form a modular support system, with a cable and bus system, by arranging in a row and making contact with further physically identical base lower parts, in order to accommodate further feeder assemblies or input and output assemblies.

10 Claims, 11 Drawing Sheets

CONSTRUCTION SYSTEM FOR LOAD FEEDERS WITH PERMANENT WIRING

FIELD OF THE INVENTION

The present invention relates to a load feeder for switching and protecting a load that can be connected in a main power circuit for voltages above 100 volts. The present invention includes a feeder assembly and a support part having first plug connections for connection to a power bus with main power cables, a data bus and, if required, an auxiliary power bus. The feeder assembly can be mechanically adapted on the support part and can make contact with the first plug connections via first mating plug connections.

BACKGROUND INFORMATION

A load feeder of this generic type is described in European Patent No. 0753916. The main power cables, the data bus and the auxiliary power bus in this case are routed as a busbar in the bottom part of the load feeder, once this has been installed in the cubicle. This means that, for installation, it must be clear from the start which switching devices must be provided at what point in the cubicle. The conventional busbar adapter system is used for connection of a motor feeder and has, on its upper face, top-hat section rails onto which a contactor and a power breaker can be snapped.

A switchgear unit with a communications capability is described PCT Application No. WO 96/42188 which, for a cubicle with a data bus, provides simple adaptation and contact-making for switching devices in conjunction with electronics that are required for data communication. The switchgear unit includes an equipment base on which a plurality of switching devices can be adapted via a standard profiled rail, as well as a communications unit, which is held on the equipment base and has plug contacts via which the electrical drive for the switching devices is provided. The switchgear unit may include, for example, a contactor and a power breaker. If another switching device is required, the equipment base is expanded by one equipment base expansion part. Main power connections for connection to a three-phase busbar system are provided on the rear wall of the equipment base of the switchgear unit. The switchgear unit is at the same time held and made contact with by hooking it on the busbars. The data is transferred to the electronics in the communications module via a bus connector or by insulation-piercing contacts on a bus cable, directly at the communications module.

In the case of automation devices, European Patent No. 0236711 described in detail the use of input/output assemblies for adaptation. The input/output assembles be snapped onto mounting rails and can connected to one another via additional control cables. In this case, the mounting racks are designed individually as modular mounting racks having a matching circuit.

A connecting block for the external wiring is mechanically connected to the mounting rack. The connecting block and the mounting rack can be connected via a plug connection to the individual assemblies.

The matching circuit in this case is in the form of a circuit board in the mounting rack. There are female connector strips on the circuit board, for connection to plug connections on the input/output assemblies. A male connector strip is used to connect the modular mounting racks to one another and, connected to the circuit board, is connected to a ribbon cable which, for its part, a female connector strip is connected. The electrical connection from the male connector strip of the adjacent mounting rack can be made via this female connector strip.

The mounting racks can be connected to one another side by side by hooking tabs, which project at the sides, into recesses, which are designed in a matching manner in the enclosures of the mounting racks. The electrical connection is made independently of this.

German Patent Application No. 197 34 709.6, which has not been published yet, discloses a switchgear system with a power bus of modular construction. In this case, a plurality of switching devices are operated via the same power supply. To this end, each switching device has an associated power bus module, which in each case has a power bus section via which the associated switching device can be electrically connected to the power supply. In this case, the power bus sections are connected to one another to form a continuous distribution rail. The power feeder can be connected at least to one of the power bus sections.

SUMMARY OF THE INVENTION

An object of the present invention is to provide a load feeder, whose installation and test complexity are improved in the context of a construction system, and which offers simple expansion capabilities, with the wiring complexity being reduced.

The object is achieved in that the support part is constructed as a modular first base lower part of a support system that can be expanded in a modular manner, with a cable and bus system in order to form a power, data and auxiliary-power bus, and, for this purpose, first cable and/or bus sections are integrated with associated second plug and mating plug connections in the first base lower part, via which second cable and/or bus sections can make contact via associated third plug and mating plug connections with a correspondingly designed second base lower part in order to expand the support system. The configuration according to the present invention results in the following advantages:

Space reduction in the cubicle

Reduction in the installation, wiring, testing, configuration and servicing cost and complexity.

The solution allows control wiring and power distribution for a remote peripheral and load feeders in one operation. The data bus, auxiliary power bus, power bus and mechanical support unit are combined to form a support system which can be assembled in advance and lengthened as required by arrangement in a row. The input and output assemblies as well as the load feeders may be constructed, configured and operated as equivalent remote peripherals in a row.

An advantageous embodiment of the present invention is achieved if the second plug connections and mating plug connections of the first base lower part make direct contact with the third plug connections and mating plug connections of a second base lower part when the latter is arranged in a row alongside the first base lower part. Contact is in this case made in conjunction with the mechanical coupling of two base lower parts, that is to say in a single operation.

If the second base lower part is part of an input and output assembly, then this allows a feeder to be joined in a simple manner to an input and output assembly in a confined space in the cubicle.

A particularly space-saving arrangement is achieved if the second plug and mating plug connections, which are associated with the first cable and/or bus sections, are provided on side walls of the base lower part.

With regard to the testing and servicing effort being as low as possible, it is advantageous for the base lower part to have a removable power bus module with power bus sections which are located in a main power circuit and via which a load can be connected to the load feeder.

A particularly simple implementation of the data bus is created if this data bus is provided by a printed circuit board having conductor tracks which are combined at one end to form a plug connection and at the other end to form a mating plug connection.

In order to achieve a simple electrical connection between a feeder assembly and the data bus, it is advantageous for a T-functionality for connecting the feeder assembly to the data bus to be produced via a plug connection in conjunction with the conductor tracks on the printed circuit board.

A particularly simple embodiment of the feeder assembly is obtained if this assembly includes a contactor, a power breaker and electronics which convert signals that can be received via the data bus into control signals for the contactor or and/the power breaker and return signals from the contact or power breaker to the data bus.

A further advantageous embodiment is provided if the base lower part has a guide shaft with plug connections for connection to the power bus, and the feeder assembly is provided with an insertion part which can be inserted into the guide shaft, has dimensions which are matched appropriately to this guide shaft and is provided with mating plug connections which make contact with the plug connections of the base lower part for mechanical adaptation of the feeder assembly.

DETAILED DESCRIPTION

Figure 1:
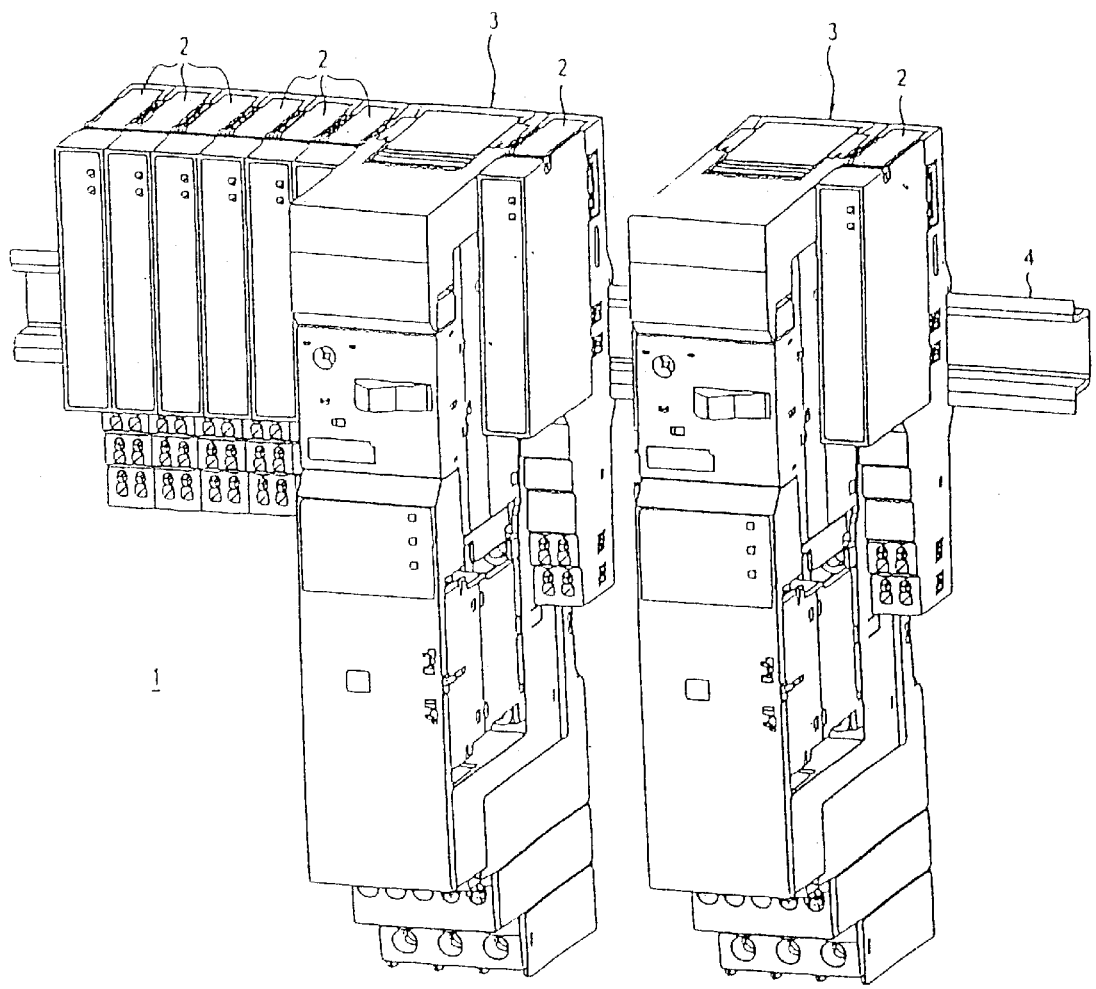
FIG. 1 shows a switching unit formed in a modular manner from a plurality of input/output assemblies and a load feeder.

The switching unit 1 illustrated in FIG. 1 is composed in a modular fashion of a plurality of digital input and output assemblies 2 and a load feeder 3 which, arranged flush against one another in a row, are each snapped onto a top-hat section rail 4. The modular construction allows the switching unit 1 to be constructed, to be configured and to be operated, matched to the respective system requirements, with an appropriate number of input and output assemblies 2 and load feeders 3 as equivalent remote peripherals in a row.

Figure 2:
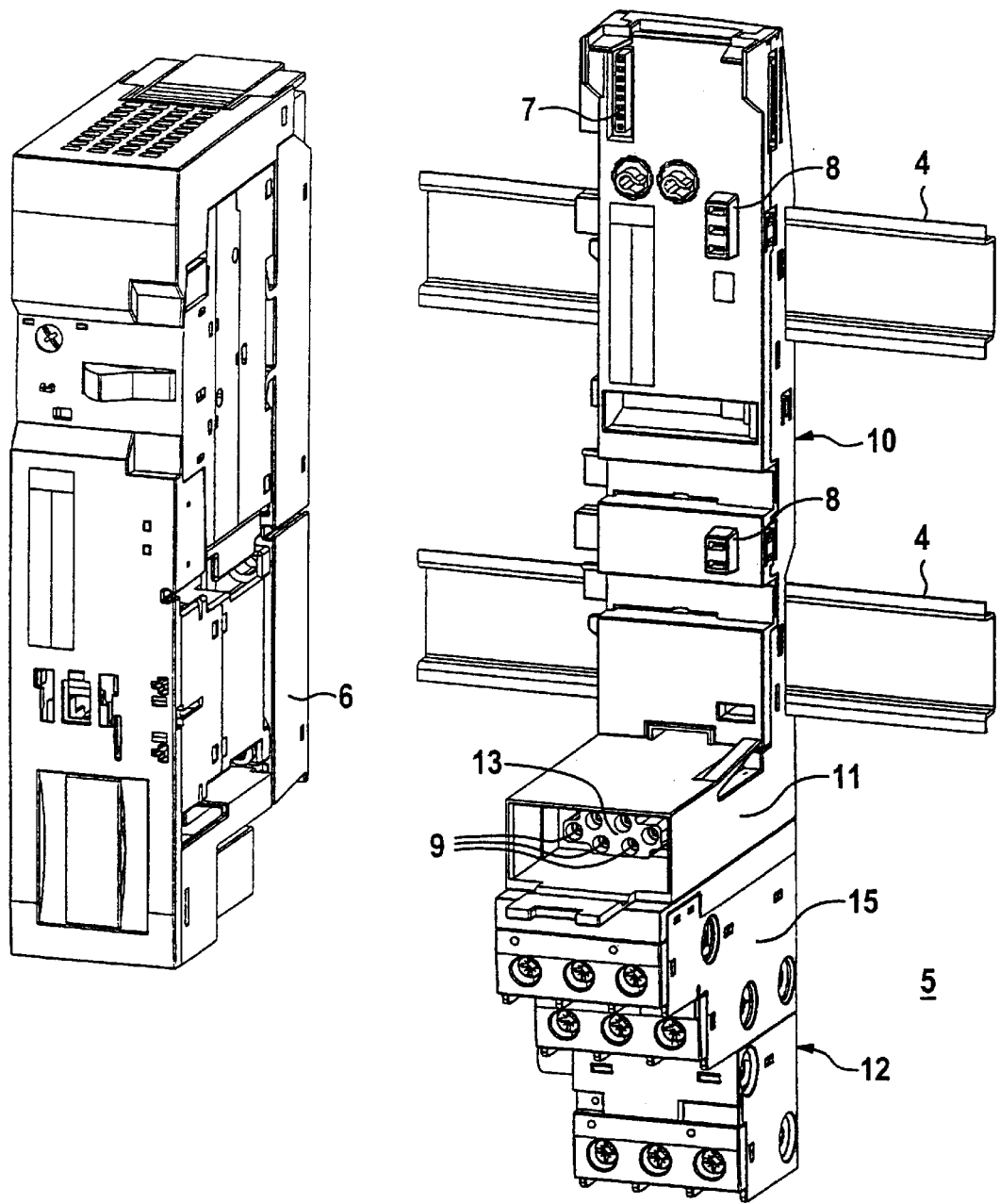
FIG. 2 shows a load feeder, shown in FIG. 1, assembled from a base lower part and a feeder assembly.
Figure 3:
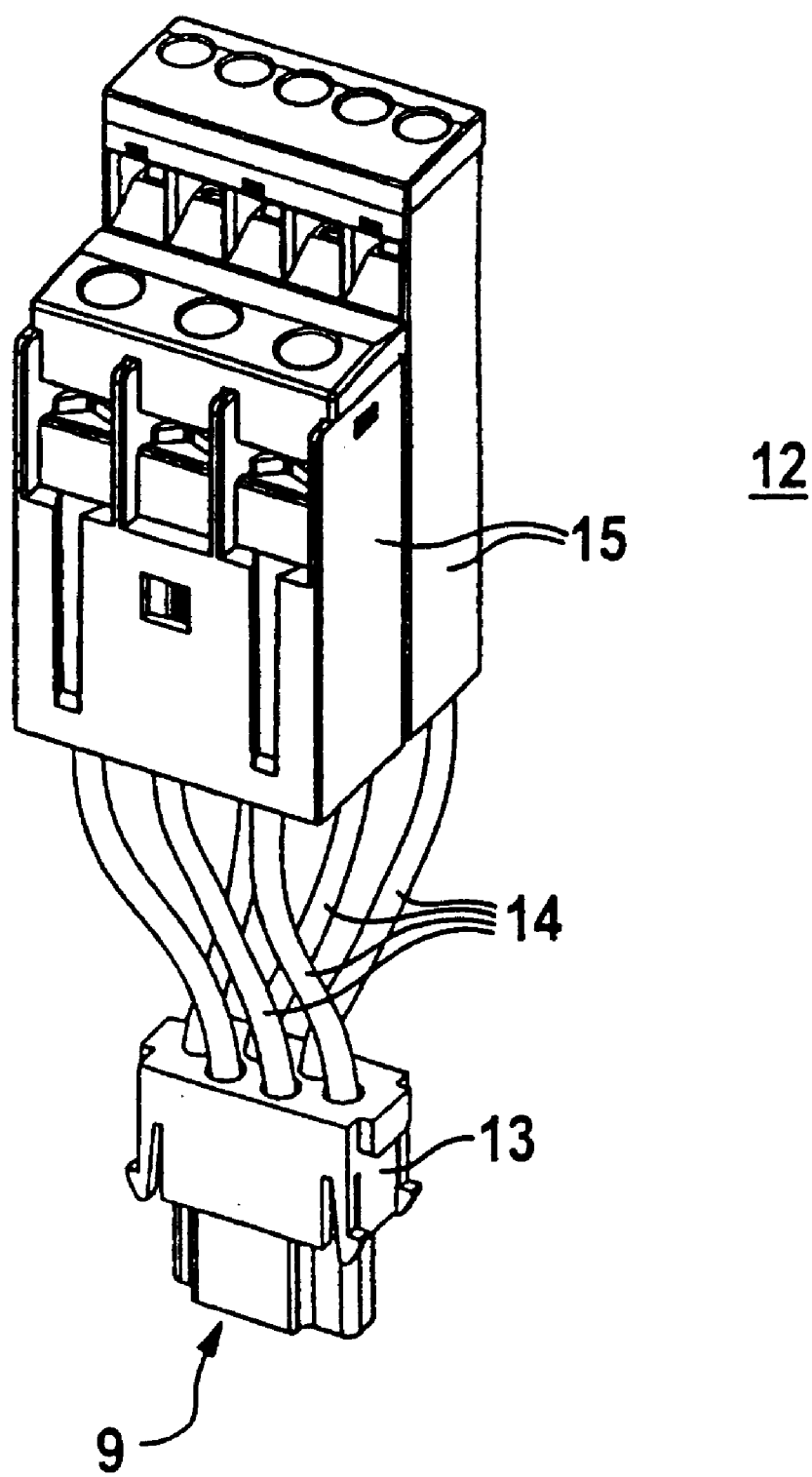
FIG. 3 shows a power bus module of a base lower part with a plug contact and a mating plug contact of a load feeder.

According to FIG. 2, the load feeder 3 includes a base lower part 5 and a feeder assembly 6, which can be latched onto it and whose physical width is the same. A data bus, at least one auxiliary power bus and a power bus are also joined together in the base lower part 5, which is used as a support unit, and here, although this cannot be seen, are located in the enclosure interior of the base lower part 5. FIG. 2 shows a male connector strip 7 for electrical connection of the feeder assembly 6 to the data bus, plug connections 8 for connection to an auxiliary power bus, and plug connections 9 for connecting the feeder assembly 6 to the power bus. These connections may also be referred to as plug connections. The base lower part 5 is composed of an L-shaped support part 10, which is in this case snapped onto two top-hat section rails 4, with a guide shaft 11 as well as a power bus module 12, which can be coupled to it, as illustrated. The power bus module 12 (e.g. a removable power bus) has a plug 13, which can be latched in the guide shaft 11, and has plug connections 9, which are connected via main power cables 14 as shown in FIG. 3 to power bus sections (which are not shown here) in the enclosure 15 of the power bus module 12.

Figure 4:
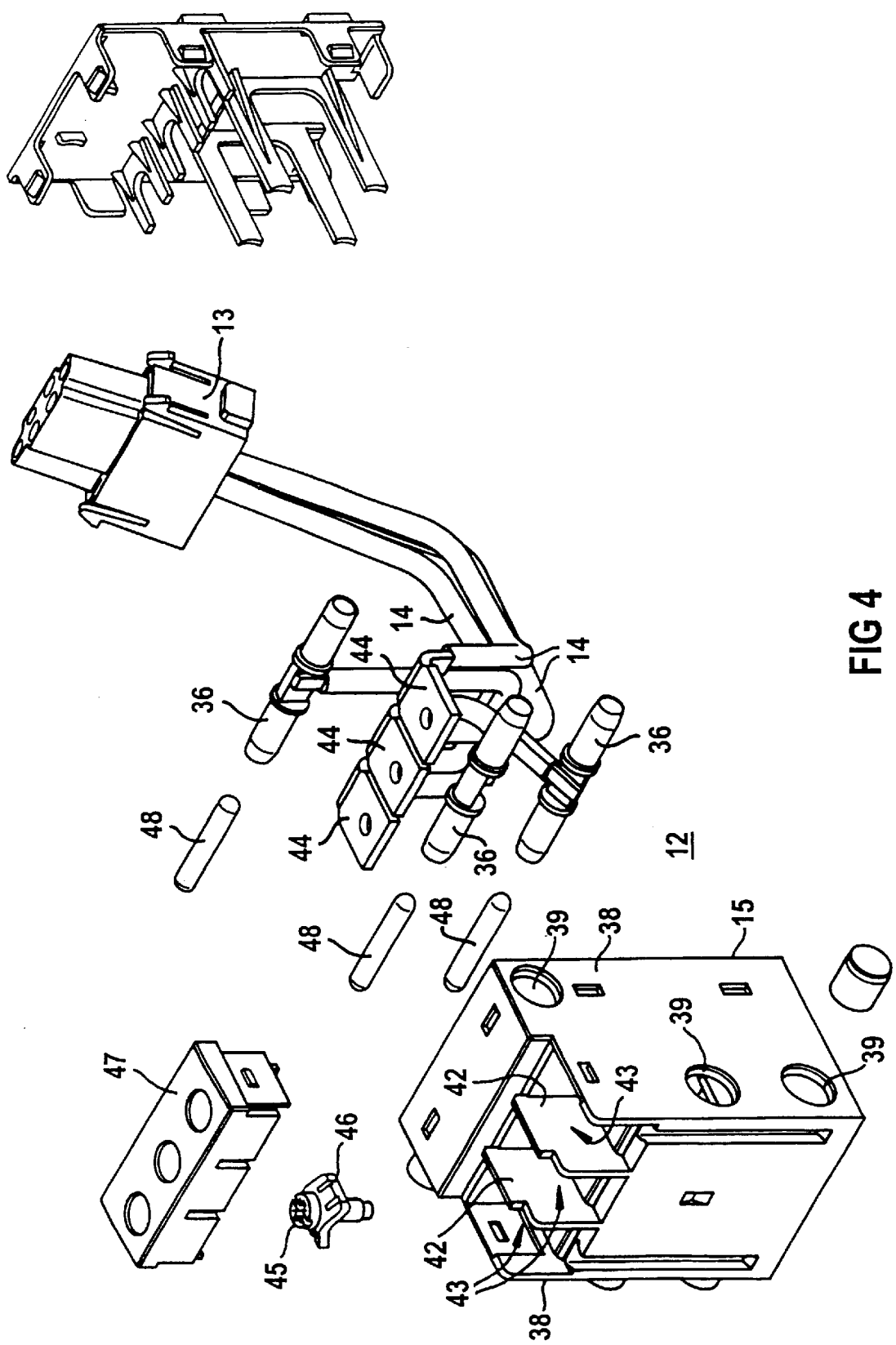
FIG. 4 shows an exploded illustration of a three-phase power bus module.

FIG. 4 shows an exploded illustration the fundamental construction of a connecting and distribution module and power bus module 12. Side walls 38 and partition walls 42 in the enclosure 15 form three chambers 43 for accommodating three connecting terminals, each of which includes a connecting plate 44, a connecting screw 45 and a connecting washer 46. Electric-shock protection is ensured by a protective cap 47, which covers the chambers 43 and can be plugged onto the enclosure 41. A power bus section 36 (e.g., a mating plug connection). which extends from side wall 38 to side wall 38, that is to say runs transversely, is connected to each connecting plate 44 and, if required, via an opening 39 in the side wall 38, can be electrically connected to a power bus section 36 of a power bus module 12 located alongside, via suitable plug elements 48.

In this way, a power bus with three continuous distribution rails can be constructed in modular form. Furthermore, a connecting cable 14 for electrical connection to the connecting terminals of the respectively associated switching device is connected to each connecting plate 44. The modular construction of the power bus offers the advantage of adaptation appropriate to the application, in which case it is sufficient for the feeding power cable to be connected only to one power bus section 36 via the connecting terminals of one of the power bus modules 12 that are connected to one another. As FIG. 4 shows, the plug 13 is provided for connecting the connecting cables 14 to the switching device.

Figure 5:
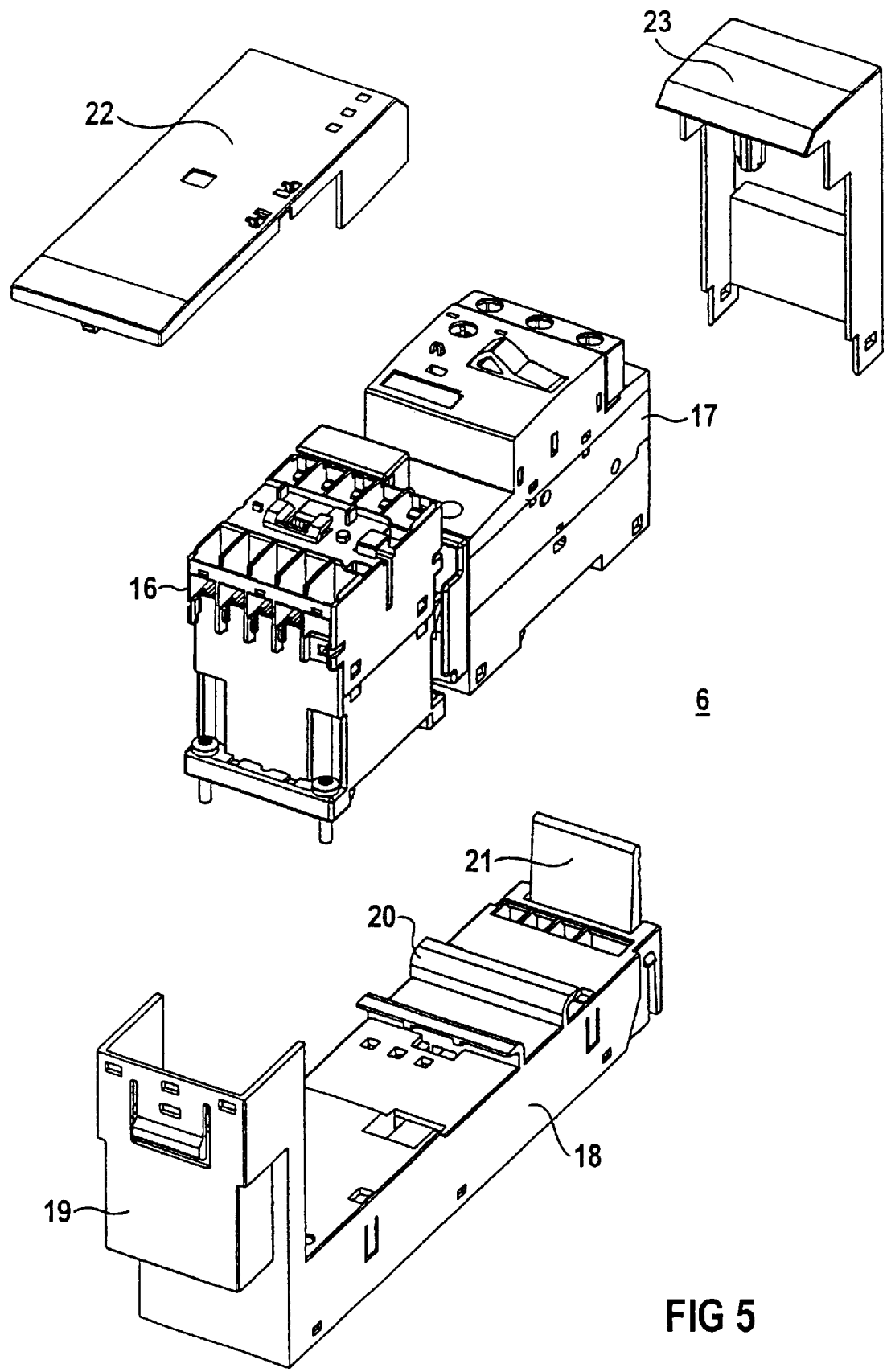
FIG. 5 shows components of a feeder assembly.

According to FIG. 5, the feeder assembly 6 includes a contactor 16, a power breaker 17 and an intermediate support 18 for mechanical adaptation of the contactor 16 and power breaker 17. The intermediate support 18 is matched to the L-shape of the support part 10 and is designed with a projecting limb as well as a rectangular channel 19, which forms a positive lock with the guide shaft 11, and, during fitting of the feeder assembly 6 as shown in FIG. 2, slides on the base lower part 5 into the guide shaft 11. As a result of which the feeder assembly 6 is guided to the desired position for latching and making contact. Mating plug connections (which are not illustrated here) are located in the rectangular channel 19, via which mating plug connections contact made is between the connections 9 and the power bus, by via the mechanical adaptation of the feeder assembly 6. The guide shaft 11 thus fulfills the two functions of accommodating the electrical plug connections and initial centering for the association between the feeder assembly 6 and the base lower part 5.

A top-hat rail section 20 is provided on the front face of the intermediate support 18 for the power breaker 17 to latch onto. A latching hook 21 is fitted at the end of the intermediate support 18 that faces away from the rectangular channel 19, and is used for the feeder assembly 6 to latch onto the base lower part 5. The feeder assembly 6 furthermore has a front cover 22 and a side cover 23, which are used for electric-shock protection.

Figure 6:
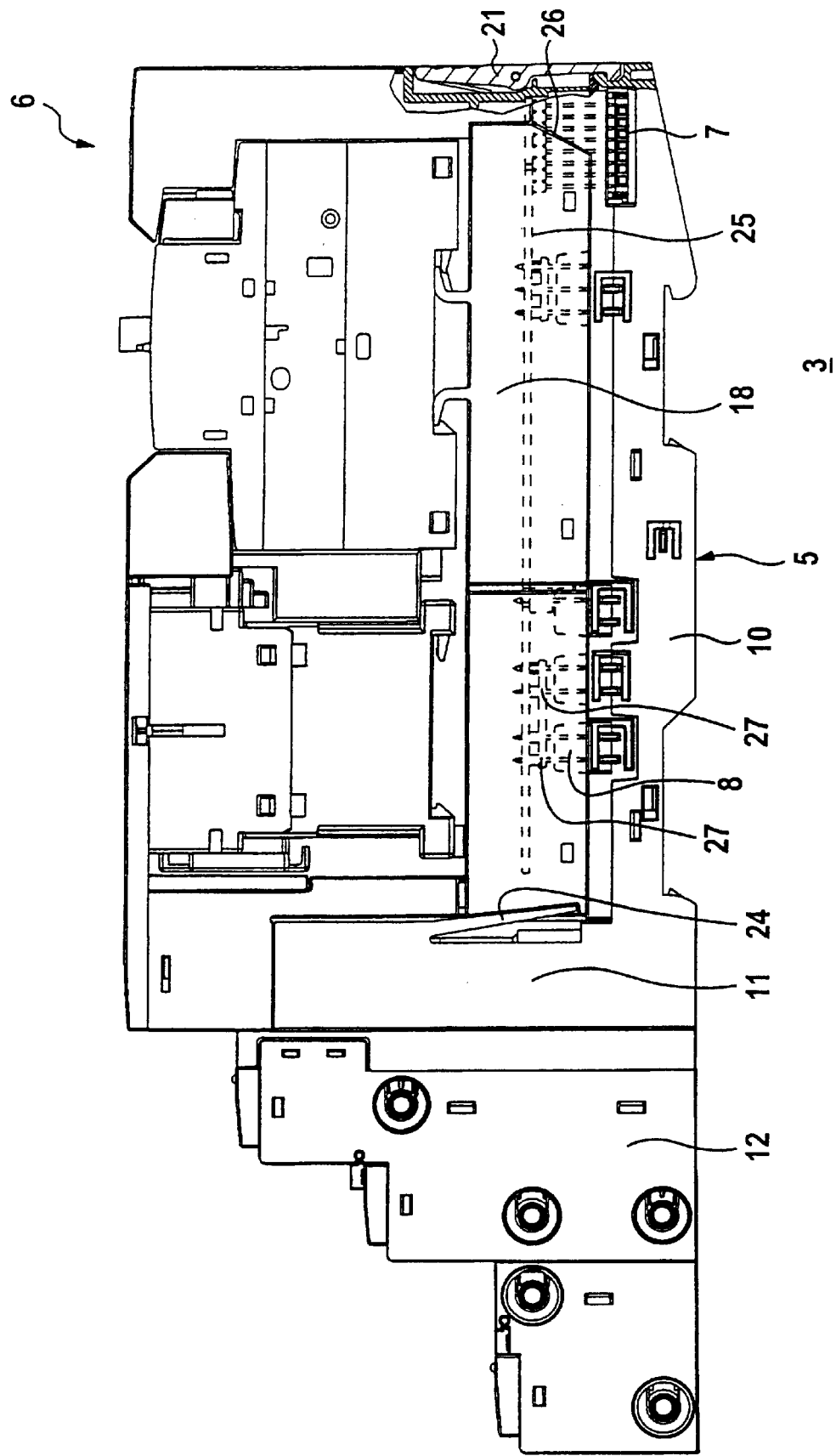
FIG. 6 shows a side view of a load feeder in an installed state.

FIG. 6 shows a side view of the load feeder 3 in the adapted state with contact made, in which state a latching spring 24 on the guide shaft 11 locks the feeder assembly 6 with respect to the base lower part 5. The feeder assembly cannot be detached until the latching hook 21 is operated, as a result of which the feeder assembly 6 first of all changes its position to a park position as shown in FIG. 7, with the load being disconnected via the contact or of the feeder assembly; only after this has been done can the plug connections of the feeder assembly be disconnected from the base lower part and pulled off the feeder assembly.

A printed circuit board 25 with the matching electronics required for signal interchange is arranged in the intermediate support 18. The mating plug connections 26, 27, or mating plug connections, which are required for connection to the data bus and to the auxiliary power bus and are in the form of a male connector strip and its blade contacts, are soldered directly to the printed circuit board 25 and make contact with the corresponding plug connections 7, 8 on the base lower part 5, on the rear side of the feeder assembly 6.

Figure 7:
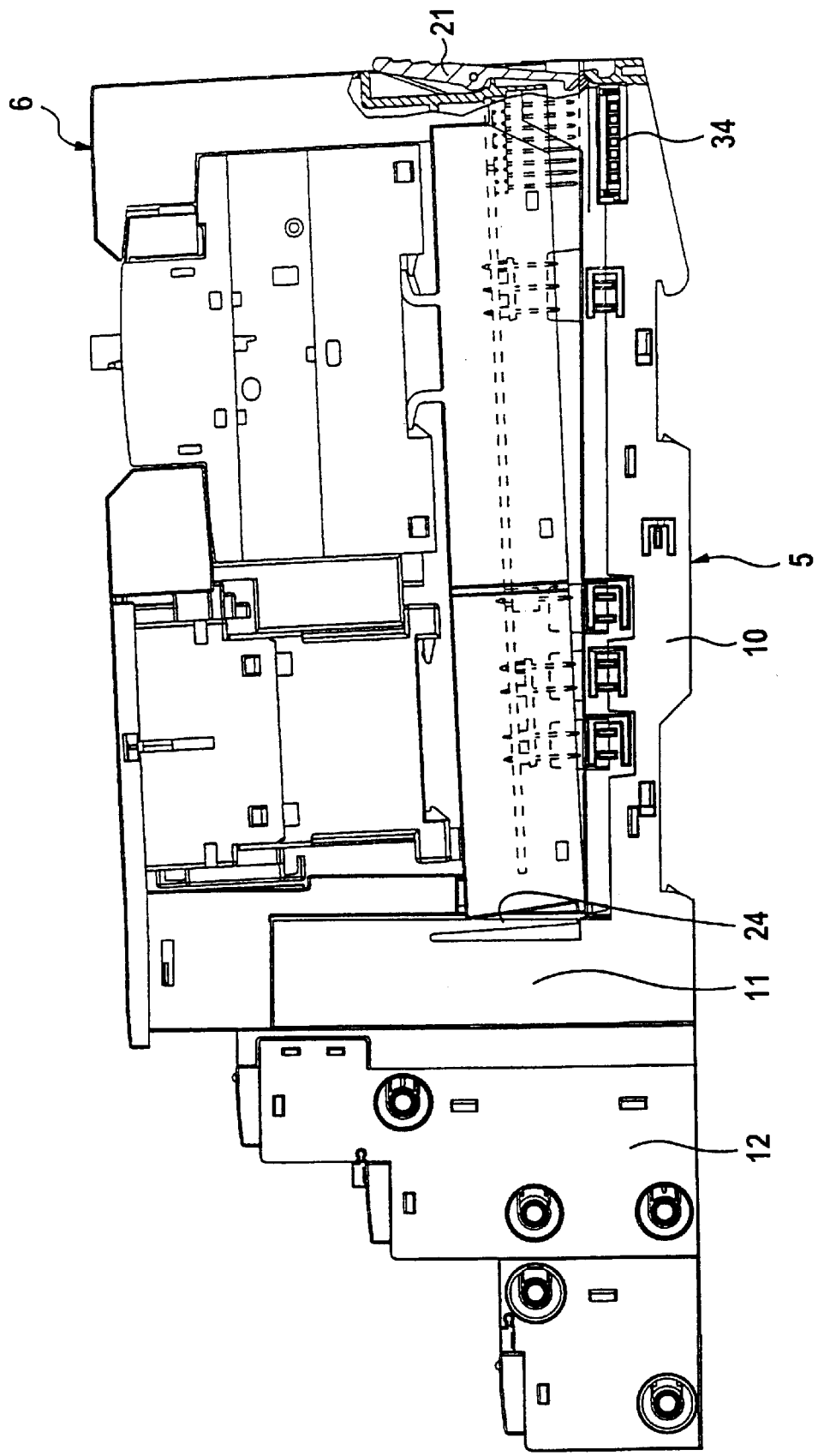
FIG. 7 shows a side view of a load feeder with a feeder assembly disconnected from the data bus in a park position.

In the park position illustrated in FIG. 7, the connections for the data bus are disconnected, and the latching hook 21 is in the prelatched position. As a result of the turning-out movement, the feeder assembly 6 presses the latching spring 24 back, and the locking to the base lower part 5 is canceled. The feeder assembly 6 cannot be pulled off the base lower part until after this has been done. The rotary movement is achieved by using the material characteristics and a joint or rotating mechanism which, according to FIGS. 8 and 9, can be provided by a structural stamping on the enclosure of the feeder assembly 6, for example via a slot 28. In this case, a spring element stamping on the intermediate support 18 ensures that the feeder assembly 6 can be turned out.

Figure 8:
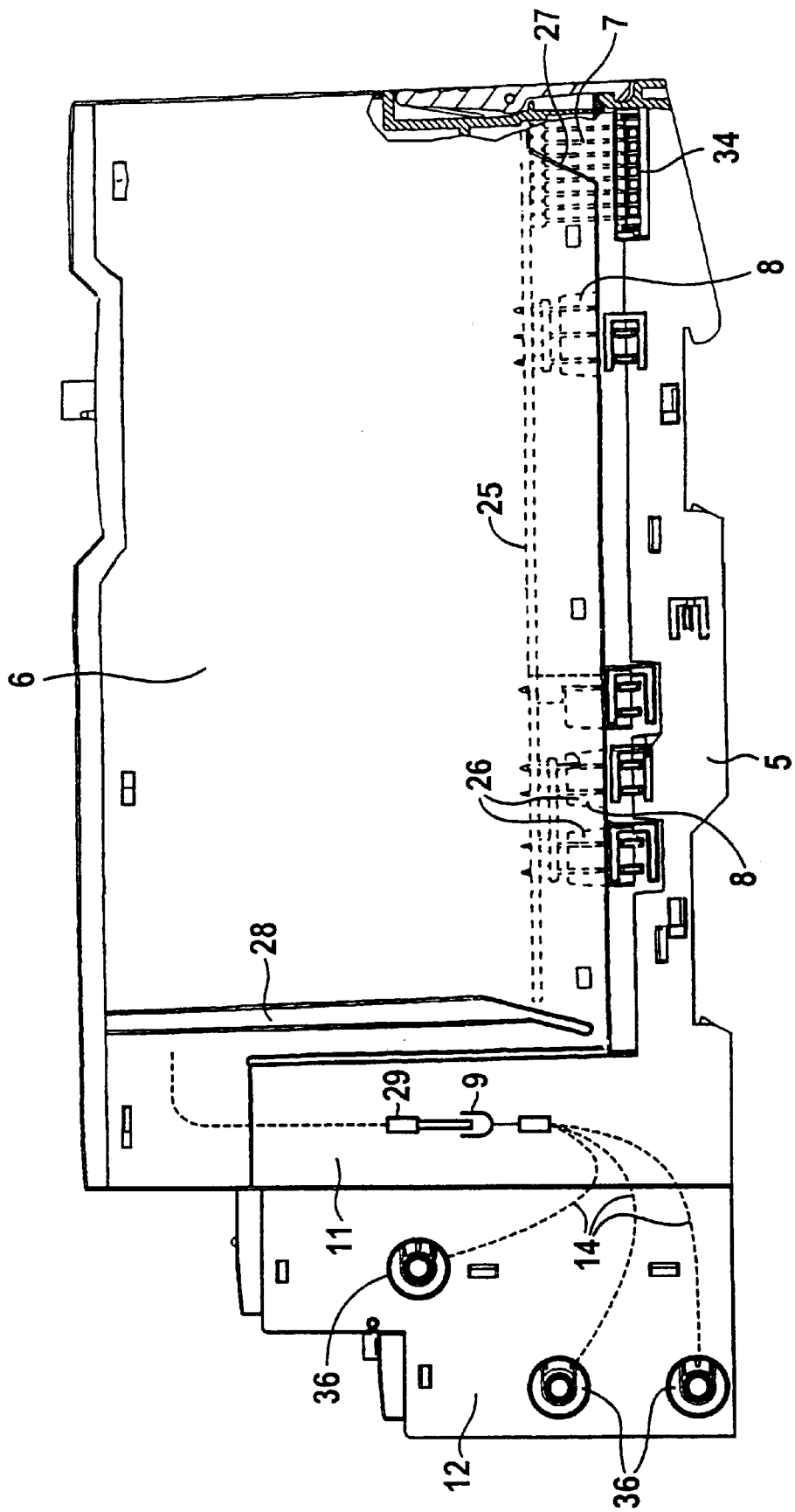
FIG. 8 shows a load feeder in contact with a data bus.
Figure 9:
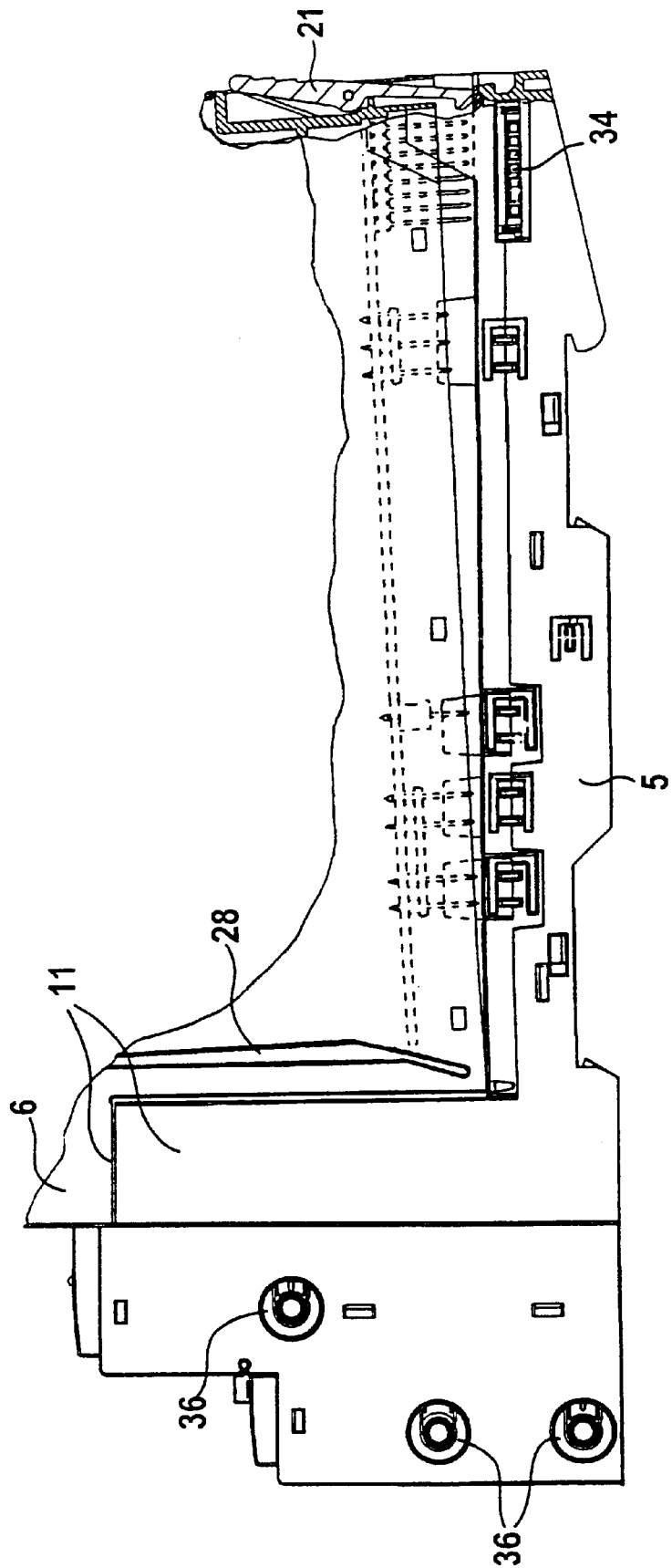
FIG. 9 shows a load feeder not in contact with a data bus connector and the feeder assembly in the park position.

FIG. 8 also shows, inter alia, the plug connection for the plug connections 9 via contact pins 29 as mating piece connections to the power bus sections 36 (e.g., bus sections).

The feeder assembly 6 need not necessarily be formed from a contactor and a power breaker. Any other desired construction is likewise feasible, such as an electronic circuit with the corresponding functions of overload protection, short-circuit protection and operational switching, as well.

Figure 10:
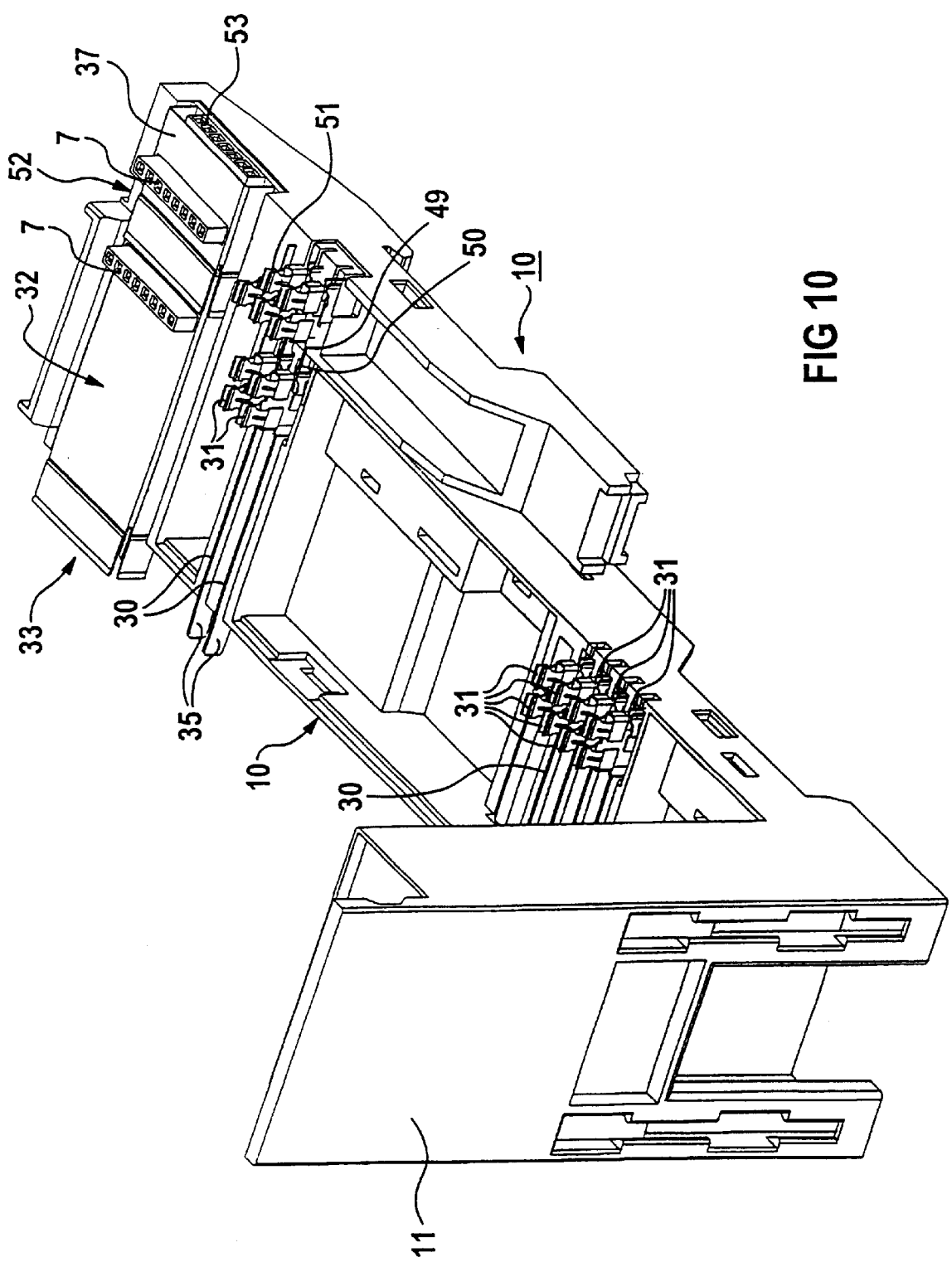
FIG. 10 shows a perspective view of a right-hand side of a base lower part (open at the top) of a load feeder with a base lower part arranged in a row and in contact with an input and output assembly.
Figure 11:
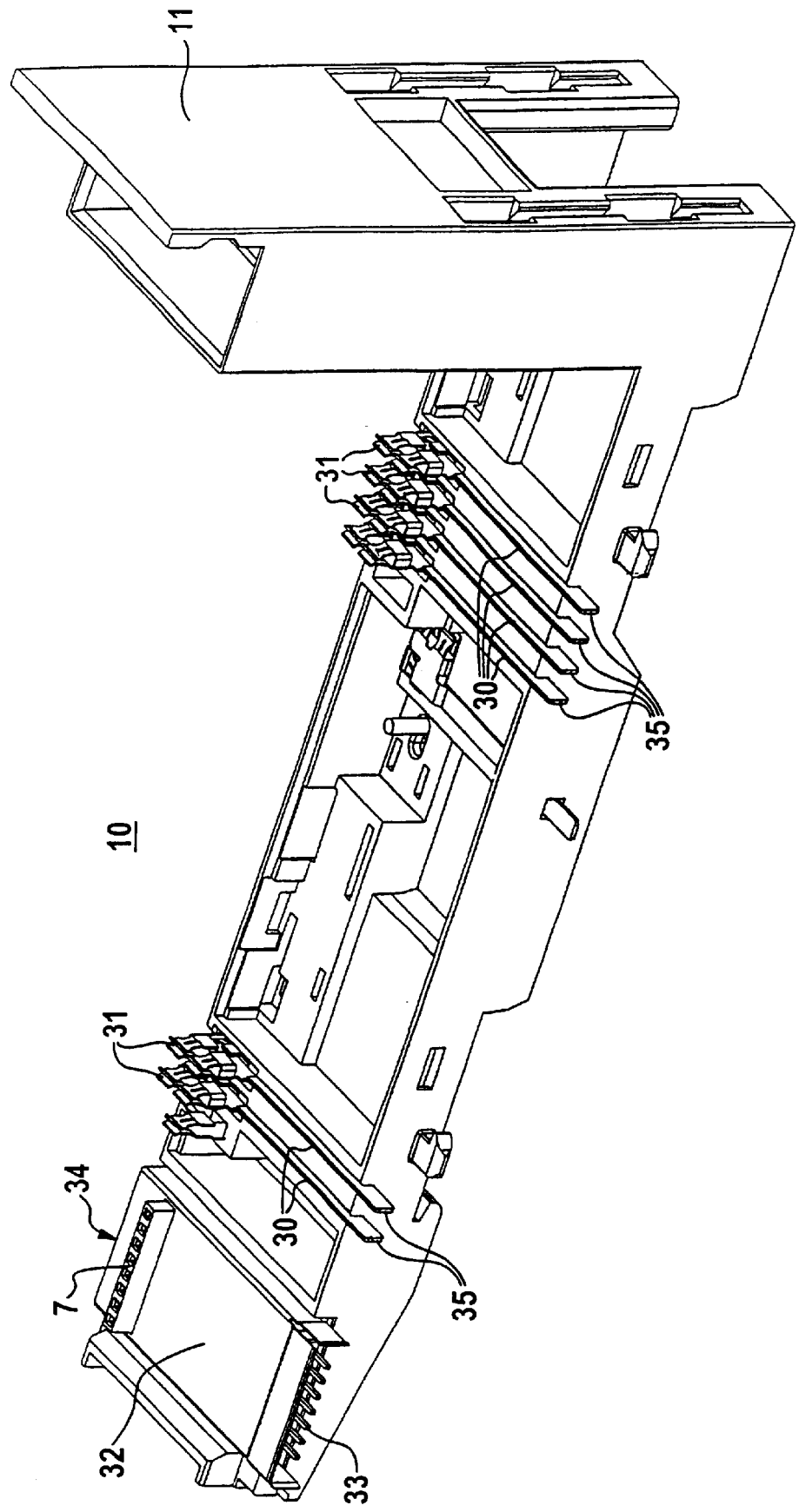
FIG. 11 shows a view from a left-hand side of a base lower part (open at the top) of a load feeder.

The L-shaped support part 10 contains. according to FIGS. 10 and 11 a plurality of busbars 30, or cable sections, which may be used as control rails and auxiliary power buses with different voltage potentials. These have horseshoe contacts 31 which can be connected at the top and at the side, and their ends 35 project beyond the enclosure edge on the other side in order to allow a side-by-side connection via the horseshoe contacts 31 (e.g. mating plug connections) of an adjacent support part, for example of an input and output assembly 2, as illustrated in FIG. 10. Furthermore, a data base 32, also know as cable section, is integrated in the support part 10 and is in the form of a printed circuit board with conductor tracks and side connections, which match one another at the end, in the form of a male connector strip 33 and a female connector strip 34 (e.g., associated plug connections). The conductor tracks are furthermore equipped with a T-functionally, for which a further male connector strip 71 pointing upwards, is provided for electrical connection of a load feeder 3 or of an input and output assembly 2.

In FIG. 10, the support part 10 for a feeder assembly 3 is electrically and mechanically connected to the support part 10 of an input and output assembly 2. In order to continue the auxiliary power buses, the input/output assembly 2 has busbars 49 with plug connections 50 and mating plug connections 51, corresponding to the configuration of the support part 10 for the feeder assembly 3. The data bus is continued via the data bus section 37 of the input/output assembly 2, with the associated male connector strips 52 and the female connector strip 53, with the said T-functionality once again being provided here-via the additional female connector strip 7 for connection of the input/output assembly 2.

What is claimed is:

1. A load feeder for switching and protecting a load connectable in a main power circuit for voltages above 100 volts, the load feeder comprising:

a support part having first plug connections for connection to a power bus module with main power cables and a data bus, the support part being formed as a modular first base lower part of a support system expandable in a modular manner;

a feeder assembly being mechanically adaptable to the support part and being connectable to the first plug connections via first mating plug connections;

at least one of first cable sections and first bus sections arranged in the modular first base lower part and integrated with associated second plug connections and second mating plug connections; and at least one of second cable sections and second bus sections making contact, via the at least one of the first cable sections and the first bus sections and via associated third plug connections and third mating plug connections, with a correspondingly designed second base lower part in order to expand the support system.

2. The load feeder according to claim 1, wherein the first plug connections are further for connection to an auxiliary power bus.

3. The load feeder according to claim 1, wherein the second plug connections and the second mating plug connections of the first base lower part make contact with the third plug connections and third mating plug connections of the second base lower part when the third plug connections and the third mating plug connections of the second base lower part are arranged in a row alongside the first base lower part.

4. The load feeder according to claim 1, wherein the second base lower part is part of an input and output assembly.

5. The load feeder according to claim 1, wherein the second plug connections and the second mating plug connections are arranged on side walls of the first base lower part.

6. The load feeder according to claim 1, wherein at least one of the first base lower part and the second base lower part includes a removable power bus module having power bus sections, and a load being connected to the load feeder via the removable power bus module.

7. The load feeder according to claim 1, wherein at least one of the first data base sections and the second bus sections includes a printed circuit board having at one end a plug connection and at another end a mating plug connection.

8. The load feeder according to claim 7, wherein the feeder assembly is connected to the data bus via T-functionality, the T-functionality being produced via the plug connection in conjunction with the printed circuit board.

9. The load feeder according to claim 1, wherein the feeder assembly includes a contactor, a power breaker and electronics, the electronics converting signals received via the data bus into control signals for at least one of the contactor and the power breaker.

10. The load feeder according to claim 1, wherein:
the first base lower part includes a guide shaft having plug connections for connection to the power bus; and
the feeder assembly includes an insertion part insertable into the guide shaft, the insertion part having dimensions corresponding to the guide shaft and mating plug connections, the mating plug connections making contact with the plug connections of the first base lower part for mechanical adaptation of the feeder assembly.

* * * * *